United States Patent
Stephany et al.

(10) Patent No.: US 6,462,780 B1
(45) Date of Patent: Oct. 8, 2002

(54) POWER AND SIGNAL INTERCONNECTION SCHEME FOR A PERSONAL ELECTRONIC PRODUCT

(75) Inventors: Thomas M. Stephany, Churchville; Carl N. Worden, Caledonia, both of NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/113,938

(22) Filed: Jul. 10, 1998

(51) Int. Cl.[7] .......................... H04N 5/225; H01M 2/10; H05K 1/14; H02J 7/00
(52) U.S. Cl. .......................... 348/372; 348/376; 429/96; 429/97; 361/737; 320/112
(58) Field of Search .................. 348/372, 376, 348/396, 301; D13/103; 320/107, 5, 116, 112; 429/127, 126, 1, 96, 97, 123, 162, 179; 361/737, 736, 814; 455/90, 575

(56) References Cited

U.S. PATENT DOCUMENTS

| | | | | |
|---|---|---|---|---|
| 4,749,875 A | * | 6/1988 | Hara | 429/127 |
| 4,918,631 A | * | 4/1990 | Hara et al. | 361/683 |
| 5,631,101 A | * | 5/1997 | Amero, Jr. | 429/97 |
| 5,644,207 A | * | 7/1997 | Lew et al. | 320/5 |
| 5,654,111 A | * | 8/1997 | Minomiya et al. | 429/126 |
| 5,797,044 A | * | 8/1998 | Lawther et al. | 396/6 |
| 5,822,001 A | * | 10/1998 | Morikawa et al. | 348/375 |
| 6,181,380 B1 | * | 1/2001 | Toyofuku et al. | 348/373 |
| 6,241,153 B1 | * | 6/2001 | Tiffany, III | 361/737 |
| 2001/0015760 A1 | * | 8/2001 | Fellegara et al. | 348/372 |

* cited by examiner

Primary Examiner—Wendy R. Garber
Assistant Examiner—Lin Ye
(74) Attorney, Agent, or Firm—Thomas H. Close

(57) ABSTRACT

A personal electronic apparatus includes a case and a flat battery located in the case and having power and ground electrodes on one side of the battery, and a plurality of interconnection electrodes extending from one side of the battery to the other. A first circuit board is located in the case on one side of the battery and has a first set of power supply contacts for contacting the power and ground electrodes on the one side of the battery, and one or more first signal contacts for contacting one or more of the interconnection electrodes. A second circuit board is located in the case on the other side of the battery and has one or more second signal contacts for contacting one or more of the interconnection electrodes.

7 Claims, 3 Drawing Sheets

POWER AND SIGNAL INTERCONNECTION SCHEME FOR A PERSONAL ELECTRONIC PRODUCT

FIELD OF THE INVENTION

This invention relates generally to personal electronic products, and more specifically to the arrangement of an electronic circuit and power supply in personal electronic products.

BACKGROUND OF THE INVENTION

When printed circuit boards are incorporated into a personal electronic product such as an electronic camera, cellular telephone, CD or tape player, or other electronic product for that matter, there is a requirement to provide power connections to the circuit boards from a battery or similar source of power. Also, any additional boards existing within the product must also be wired with power and ground connections to allow for the flow of electrical power. Similarly, interconnections in the form of wires, ribbon cables and the like are also required to route the necessary operating signals between these circuit boards, for the purpose of providing proper circuit operation. This typical method of construction utilizes a large number of discrete wires which are costly, consume space, and are subject to be broken through movement if the personal electronic apparatus is disassembled for service, upgrade or inspection. There is a need therefore for an architecture that avoids these problems. It would also be desirable to provide a personal electronic product that is readily pocketable, and therefore as thin as possible.

SUMMARY OF THE INVENTION

The above noted problems are solved according to the present invention by providing a personal electronic apparatus which includes a case and a flat battery located in the case and having power and ground electrodes on one side of the battery, and a plurality of interconnection electrodes extending from one side of the battery to the other. A first circuit board is arranged in the case on one side of the battery and has a first set of power supply contacts for contacting the power and ground electrodes on the one side of the battery, and one or more first signal contacts for contacting one or more of the interconnection electrodes. A second circuit board is located in the case on the other side of the battery and has one or more second signal contacts for contacting one or more of the interconnections.

According to a preferred embodiment of the invention, the apparatus is an electronic camera wherein all wiring interconnects including power, ground and electrical signals between two circuit boards, one being a sensor board and the second being a display board are provided through the contacts on the flat battery.

ADVANTAGES

The present invention has the advantage of providing a flat configuration for a thin personal electronic apparatus which possesses means for providing all the necessary power, ground and signal connections between circuit boards and battery for the personal electronic apparatus without the need for hard wired connections.

Still another advantage of the present invention is that it provides a method of construction which utilizes a flat battery for a thin digital personal electronic apparatus which substantially reduces the assembly costs of said thin digital personal electronic apparatus.

A still further advantage of the present invention is that it provides greatly enhanced operational reliability and ease of upgrade and repair.

DETAILED DESCRIPTION OF THE INVENTION

The flat battery in accordance with the present invention is characterized in that a specific set of electrodes are formed on the body of the battery for the purpose of providing interconnections between circuit boards in the apparatus. These electrodes are contacted by probes which are formed on the circuit boards. Upon the closing of the apparatus case, these probes make contact with their corresponding electrodes on the battery, thus completing all necessary connections for proper operation of the apparatus.

Figure 1:
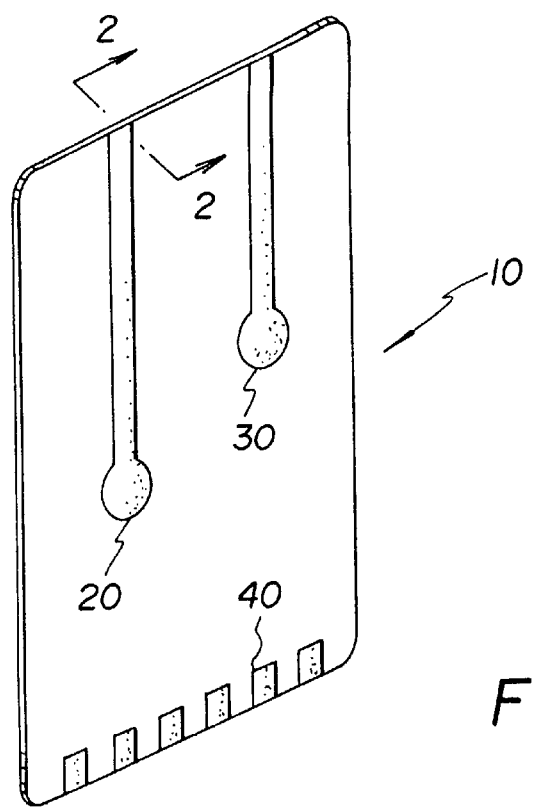
FIG. 1 is a perspective view of a flat battery employed in the present invention.
Figure 2:
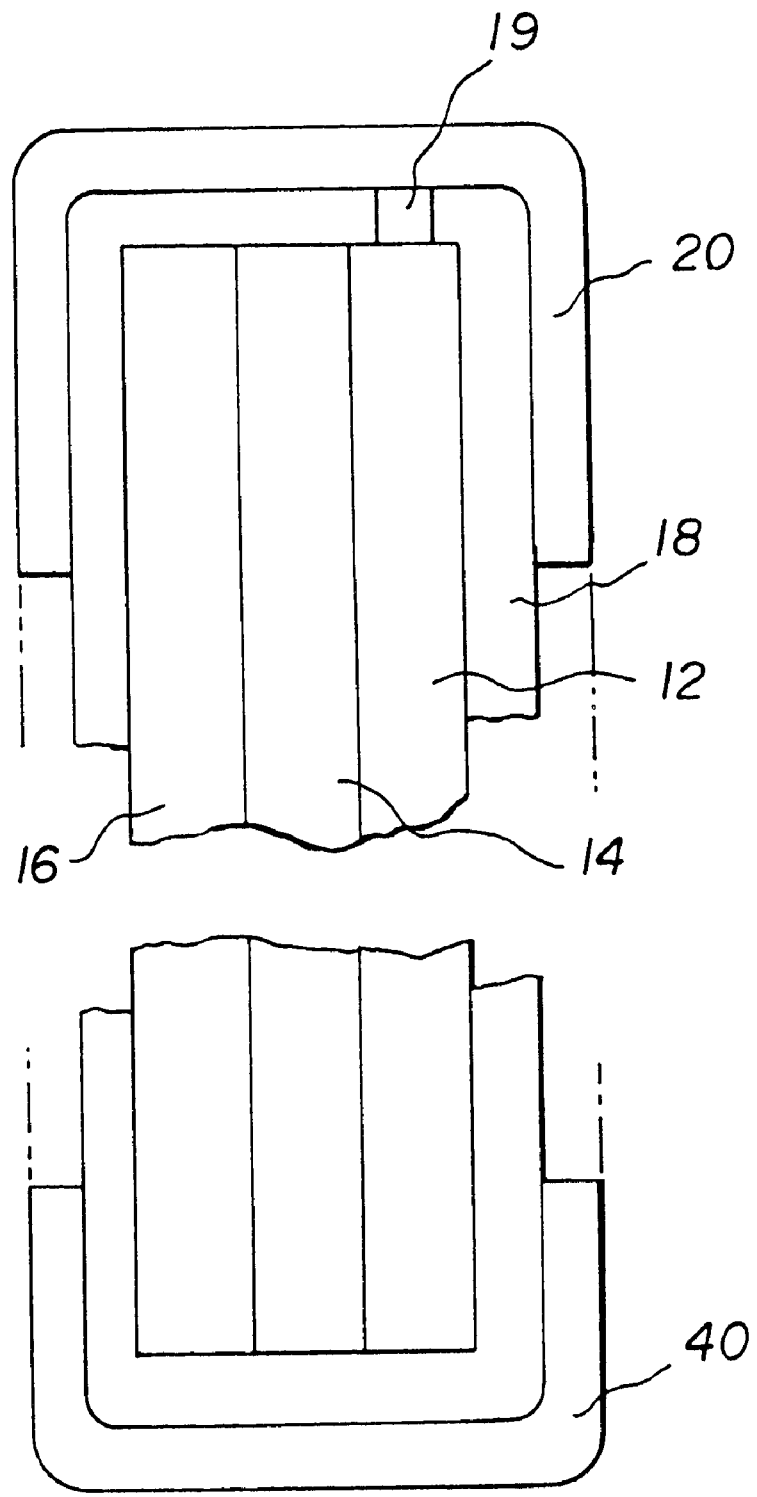
FIG. 2 is a partial cross section of the flat battery taken along line 2—2 in FIG. 1.

Referring now to FIG. 1, a flat battery 10 of the present invention is shown with a positive power electrode 20 and ground electrode 30 on one side. Flat batteries are well known in the art and are commercially available from sources such as Polaroid Corp., Cambridge, Mass., and Ultralife Corp., Newark, N.Y. The flat battery employed in the present invention may be either replaceable, or rechargeable. On one end of the flat battery 10 are multiple signal interconnection electrodes 40 for the transmission of electrical signals between the two circuit boards. Referring to FIG. 2, a partial cross sectional view of the flat battery 10 is shown. The battery 10 includes an anode 12, an electrolyte layer 14, and a cathode 16. The active components of the flat battery are contained in an insulating envelope 18. The positive power electrode 20 is electrically connected through the envelope 18 to anode 12 by a conductive via 19. The ground electrode 30 is similarly connected to cathode 16. Signal interconnection electrodes 40 are not connected internally to the battery, but merely wrap around it to provide an electrically conductive path from one side to the other. Alternatively, insulated vias through the battery may be employed to provide the signal interconnections from one side of the battery to the other.

In the preferred embodiment of the invention, power and ground electrodes are provided on both sides of the flat battery 10, however it will be understood that the power and ground electrodes may be provided on only one side of the battery, and power may be conducted to the circuit board on the other side of the battery by power interconnection electrodes similar to the signal interconnection electrodes. The specific configuration and placement of the electrodes on the surfaces of the battery are arbitrary.

Figure 3:
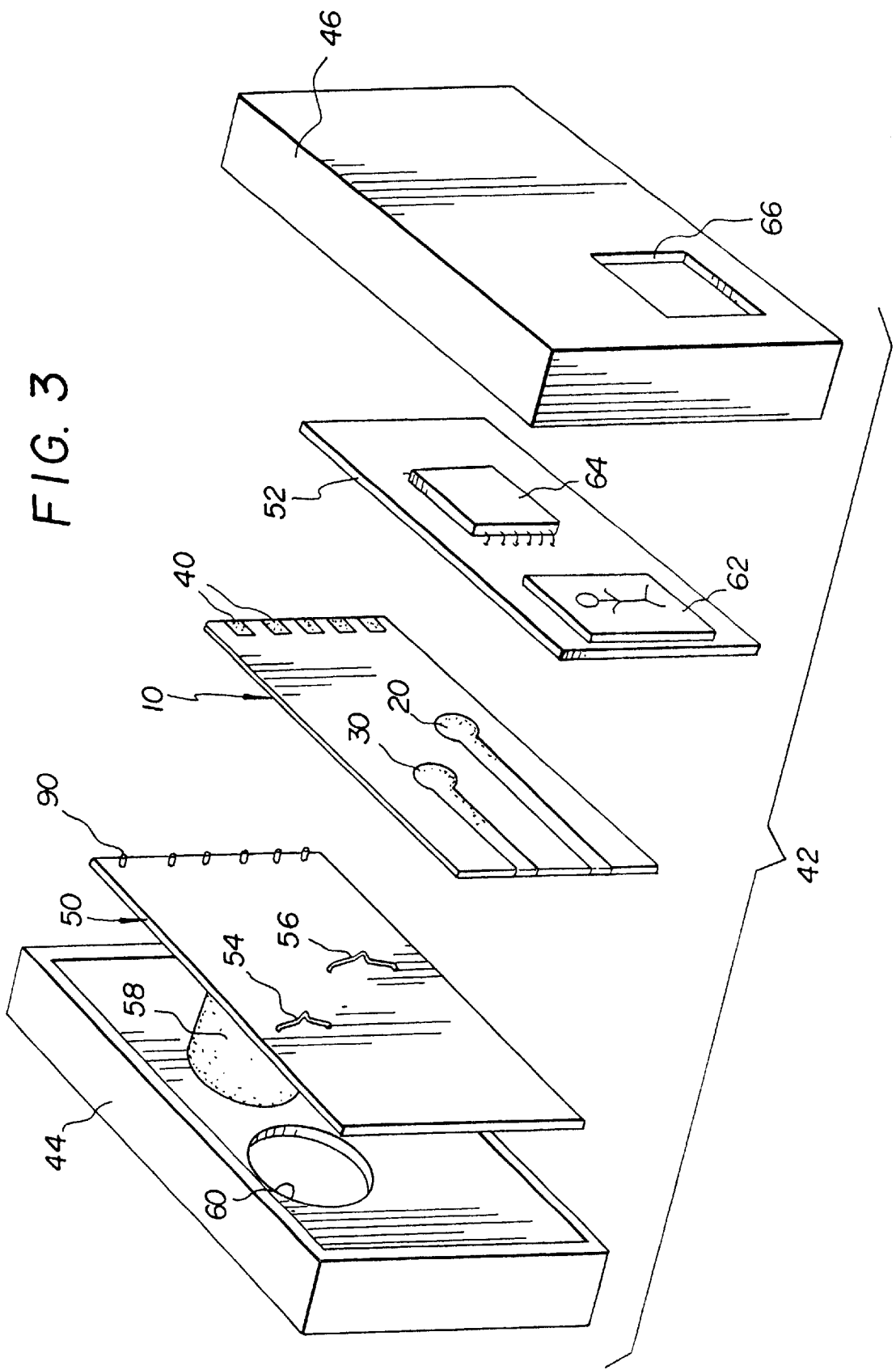
FIG. 3 is an exploded perspective view of an electronic camera constructed according to the present invention.

Referring now to FIG. 3, an exploded view of an electronic camera, generally designated 42, constructed according to the present invention, includes a case having a front half 44 and a rear half 46. The case contains an imager circuit board 50, a display circuit board 52, and the flat battery 10. The circuit boards 50 and 52 are provided with spring contacts 54 and 56. The contacts are located on the front side of imager circuit board 52 and are therefore not shown in FIG. 3.

Imager circuit board 50 includes an image sensor package 58 mounted on its front surface. Image sensor package 58 comprises for example a taking lens and an electronic image sensor with associated control and drive electronics. An opening 60 is provided in front case half 44 for the taking lens of the image sensor package. Display circuit board 52 includes an electronic display 62 mounted on its rear surface. The electronic display 62 comprises for example a liquid crystal display and associated drive circuitry. The camera also includes a controller, such as a microprocessor (not shown), mounted on the front of circuit board 50 and a memory 64 mounted on the back of display circuit board 52. An aperture 66 is provided in the back case half 46 for viewing the display.

The circuit boards 50 and 52 are provided with signal contacts 90 for contacting interconnection electrodes 40 on flat battery 10, whereby electrical connection between the circuit boards is provided. It will be understood that other well known components of an electronic camera, such as power switch, picture taking button, and other control interface elements, are provided on either circuit board 50 or 52 and suitable apertures are provided in the case halves for accessing them. If the flat battery 10 is a rechargeable battery, appropriate recharging contacts are provided. If the flat battery 10 is replaceable, a suitable access in the case is provided. To assemble the camera, the components are simply stacked in their proper relationship and the case halves are secured together around them (for example by snap fit, adhesive, or screw fastener) to complete all electrical connections and final assembly of the camera.

Figure 4:
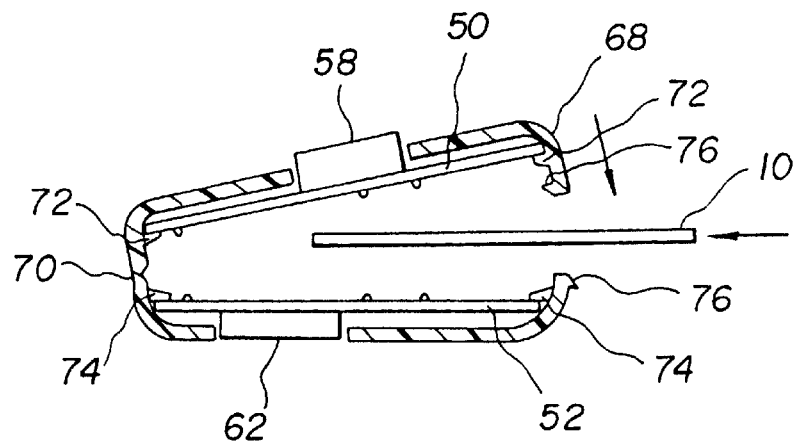
FIG. 4 is a side cross sectional view of the electronic camera of FIG. 3, showing an alternative clam shell case for assembling the components.

Referring now to FIG. 4 an alternative case for the electronic camera is shown. The case is a clam shell case 68 having an integral hinge 70. During assembly, circuit board 50 is inserted and held into the top half of the clamshell case 68, for example by detents 72. Similarly, circuit board 52 is inserted and held in the bottom half of the case by detents 74. The flat battery 10 is then inserted into the case between the circuit boards and the case is closed and latched, for example by latch members 76, thereby completing the electrical connections and assembly of the camera. If the battery needs to be replaced, the camera is simply snapped open to remove the old battery and insert the new one, and snapped closed.

The invention has been described in detail with particular reference to certain preferred embodiments thereof, but it will be understood that variations and modifications can be effected within the spirit and scope of the invention.

Parts List

10 Flat battery
12 Anode
14 Electrolyte Layer
16 Cathode
18 Insulating Envelope
19 Conductive Via
20 Positive Power Electrode
30 Ground Electrode
40 Signal Interconnection Electrodes
42 Electronic Camera
44 Front Case Half
46 Rear Case Half
50 Imager Circuit Board
52 Display Circuit Board
54 Spring Contact
56 Spring Contact
58 inage Sensor Package
60 Opening in Front Case Half
62 Electronic Display
64 Memory
66 Rear Case Aperture
68 Clam Shell Case
70 Integral Hinge
72 Detents
74 Detents
76 Latch Members
90 Signal Contacts

What is claimed is:

1. A personal electronic apparatus, comprising:

a) a case;

b) a flat battery located in the case and having power and ground electrodes on one side of the battery, and a plurality of interconnection electrodes extending from one side of the battery to the other, the interconnection electrodes are not connected internally to the battery, but merely provide an electrically conductive path from one side of the battery to the other;

c) a first circuit board located in the case on one side of the battery and having a first set of power supply contacts for contacting the power and ground electrodes on the one side of the battery, and one or more first signal contacts for contacting one or more of the interconnection electrodes; and d) a second circuit board located in the case on the other side of the battery and having one or more second signal contacts for contacting one or more of the interconnection electrodes.

2. The personal electronic apparatus claimed in claim 1, wherein the flat battery includes a second set of power supply electrodes on the other side of the battery and the second circuit board includes a second set of power supply contacts for contacting the power and ground electrodes on the other side of the battery.

3. The personal electronic apparatus claimed in claim 1, wherein the case is a clam shell case adapted to be folded during assembly around the flat battery and the first and second circuit boards.

4. The personal electronic apparatus claimed in claim 1, wherein the case is a box type case adapted to receive during assembly the flat battery and the first and second circuit boards.

5. The personal electronic apparatus claimed in claim 1, wherein the apparatus is an electronic camera, and further comprising:

a) an image sensor package mounted on the first circuit board;

b) an electronic display mounted on the second circuit board; and c) the case defining apertures for the image sensor package and the electronic display.

6. The apparatus claimed in claim 1, wherein the interconnection electrodes are conductors that wrap around the outside of the battery.

7. The apparatus claimed in claim 1, wherein the interconnection electrodes are vias through the battery.

* * * * *